US008441852B2

(12) United States Patent
Park et al.

(10) Patent No.: US 8,441,852 B2
(45) Date of Patent: May 14, 2013

(54) STACKED MEMORY DEVICE AND METHOD OF FABRICATING SAME

(75) Inventors: Chul-Woo Park, Yongin-si (KR); Hong-Sun Hwang, Suwon-si (KR); In-Gyu Baek, Seoul (KR); Dong-Hyun Sohn, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 210 days.

(21) Appl. No.: 13/024,566

(22) Filed: Feb. 10, 2011

(65) Prior Publication Data
US 2011/0228582 A1 Sep. 22, 2011

(30) Foreign Application Priority Data
Mar. 18, 2010 (KR) .................. 10-2010-0024404

(51) Int. Cl.
*G11C 11/34* (2006.01)
(52) U.S. Cl.
USPC ................... 365/185.05; 365/230.06; 365/51; 365/170; 365/180

(58) Field of Classification Search ............. 365/185.05, 365/230.06, 51, 170, 180
See application file for complete search history.

(56) References Cited

U.S. PATENT DOCUMENTS

| 6,483,741 B1 * | 11/2002 | Iwasaki et al. ................ 365/170 |
| 7,590,024 B2 | 9/2009 | Kang |
| 2003/0227795 A1 | 12/2003 | Seyyedy et al. |

FOREIGN PATENT DOCUMENTS

| KR | 100827697 B1 | 4/2008 |
| KR | 1020090027561 A | 3/2009 |

* cited by examiner

*Primary Examiner* — Jason Lappas
(74) *Attorney, Agent, or Firm* — Volentine & Whitt, PLLC

(57) ABSTRACT

A stacked semiconductor memory device comprises a semiconductor substrate having a functional circuit, a plurality of memory cell array layers, and at least one connection layer. The memory cell array layers are stacked above the semiconductor substrate. The connection layers are stacked above the semiconductor substrate independent of the memory cell array layers. The connection layers electrically connect memory cell selecting lines arranged on the memory cell array layers to the functional circuit.

17 Claims, 13 Drawing Sheets

STACKED MEMORY DEVICE AND METHOD OF FABRICATING SAME

CROSS-REFERENCE TO RELATED APPLICATION

This application claims priority under 35 U.S.C. §119 to Korean Patent Application No. 10-2010-0024404 filed on Mar. 18, 2010, the disclosure of which is hereby incorporated by reference in its entirety.

BACKGROUND

Embodiments of the inventive concept relate generally to semiconductor memory devices. More particularly, embodiments of the inventive concept relate to semiconductor memory devices having a stacked structure and related methods of manufacture.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power. Examples of volatile memory devices include dynamic random access memory (DRAM) and static random access memory (SRAM). Examples of nonvolatile memory include phase-change RAM (PRAM), resistive RAM (RRAM), magnetic RAM (MRAM), and electrically erasable programmable read only memory (EEPROM).

Nonvolatile memory devices have gained increasing popularity in recent years due to a variety of trends, such as the increasing demand for long term data storage and the proliferation of mobile devices that need to retain stored data when disconnected from power.

Some nonvolatile memory devices store data using variable resistance elements that change between different resistive states to represent different data values. Such nonvolatile memory devices are referred to as resistive memory devices. A resistive memory device typically comprises a plurality of memory cells each comprising a variable resistive element and a switching element. The variable resistive element is connected between a bitline and the switching element, and the switching element is typically connected between the variable resistive element and a wordline. The memory cells are generally connected in a memory cell array connected to a plurality of wordlines and bitlines.

Examples of resistive memory devices include PRAM, RRAM, and MRAM. In a PRAM, the variable resistance element comprises a phase-change material such as chalcogenide that changes resistance in response to an applied temperature. In an RRAM, the variable resistance element comprises an upper electrode, a lower electrode, and a transition metal oxide between the upper and lower electrodes. In an MRAM, the variable resistive element comprises a ferromagnetic upper electrode, a ferromagnetic lower electrode, and a ferromagnetic material between the upper and lower electrodes. In an effort to improve the performance and storage density of resistive memory devices, researchers have developed resistive memory devices in which memory cell array layers are stacked in a 3-dimensional configuration on a semiconductor substrate.

SUMMARY

Embodiments of the inventive concept provide stacked semiconductor memory devices that connect memory cell selecting lines in memory cell array layers above a semiconductor substrate to a functional circuit in the semiconductor substrate. Embodiments of the inventive concept also provide memory systems incorporating the stacked semiconductor memory devices and methods of fabricating the stacked semiconductor memory devices.

According to one embodiment of the inventive concept, a stacked semiconductor memory device comprises a semiconductor substrate, a functional circuit formed on the semiconductor substrate, a plurality of memory cell array layers stacked above the semiconductor substrate, and at least one connection layer stacked above the semiconductor substrate independent of the memory cell array layers, wherein the at least one connection layer electrically connects memory cell selecting lines of the memory cell array layers to the functional circuit.

In certain embodiments, the at least one connection layer is formed above an uppermost memory cell array layer among the memory cell array layers.

In certain embodiments, the memory cell selecting lines are electrically connected to the functional circuit after a metal process of the memory cell array layers is completed.

In certain embodiments, the plurality of memory cell array layers are divided into a plurality of array layer groups separated by the at least one connection layer.

In certain embodiments, the at least one connection layer is disposed above each of the array layer groups.

In certain embodiments, memory cell selecting lines included in each of the array layer groups are electrically connected to the functional circuit after a metal process of each of the array layer groups is completed.

In certain embodiments, the memory cell selecting lines comprise bitlines or wordlines for selecting memory cells in each of the memory cell array layers.

In certain embodiments, the memory cell array layers comprise resistive memory cells.

In certain embodiments, memory cell selecting lines arranged in each of the memory cell array layers are electrically connected to the functional circuit through at least one horizontal connection line and at least one vertical connection line.

In certain embodiments, memory cell selecting lines arranged in some of the memory cell array layers are electrically connected to the functional circuit on a left side of the memory cell array layers, and memory cell selecting lines arranged in other memory cell array layers are electrically connected to the functional circuit on a right side of the memory cell array layers.

In certain embodiments, memory cell selecting lines arranged in the memory cell array layers are alternately connected to the functional circuit on the left side and right side of the memory cell array layers.

In certain embodiments, the memory cell array layers comprise memory cell array regions having different sizes from each other.

In certain embodiments, the memory cell array regions decrease in size as a distance from the semiconductor substrate increases.

In certain embodiments, the memory cell array layers decrease in size as a distance from the semiconductor substrate increases, and the corresponding memory cell array regions decrease to scale with the memory cell array layers.

According to another embodiment of the inventive concept, a memory system comprises a memory controller configured to generate address signals and command signals, and a stacked semiconductor memory device that stores received data or outputs stored data based on the address signals and the command signals. The stacked semiconductor memory device comprises a semiconductor substrate, a functional circuit formed on the semiconductor substrate, a plurality of memory cell array layers stacked above the semiconductor substrate, and at least one connection layer stacked above the semiconductor substrate independent of the memory cell array layers, wherein the at least one connection layer electrically connects memory cell selecting lines of the memory cell array layers to the functional circuit.

In certain embodiments, the at least one connection layer is formed above an uppermost memory cell array layer among the memory cell array layers.

In certain embodiments, the plurality of memory cell array layers are divided into a plurality of array layer groups separated by the at least one connection layer.

According to another embodiment of the inventive concept, a method of fabricating a stacked semiconductor memory device comprises forming a functional circuit on a semiconductor substrate, forming a plurality of memory cell array layers stacked above the semiconductor substrate and in parallel with the semiconductor substrate, forming memory cells and memory cell selecting lines on each of the memory cell array layers, and forming at least one connection layer for electrically connecting the memory cell selecting lines to the functional circuit in parallel with the semiconductor substrate.

In certain embodiments, forming at least one connection layer comprises forming a connection layer disposed above an uppermost memory cell array layer among the memory cell array layers.

In certain embodiments, wherein forming at least one connection layer comprises forming a connection layer disposed above each of a plurality of array layer groups each comprising at least one of the plurality of memory cell array layers.

BRIEF DESCRIPTION OF THE DRAWINGS

The drawings illustrate selected embodiments of the inventive concept. In the drawings, like reference numbers indicate like features.

DETAILED DESCRIPTION OF EMBODIMENTS

Figure 1:
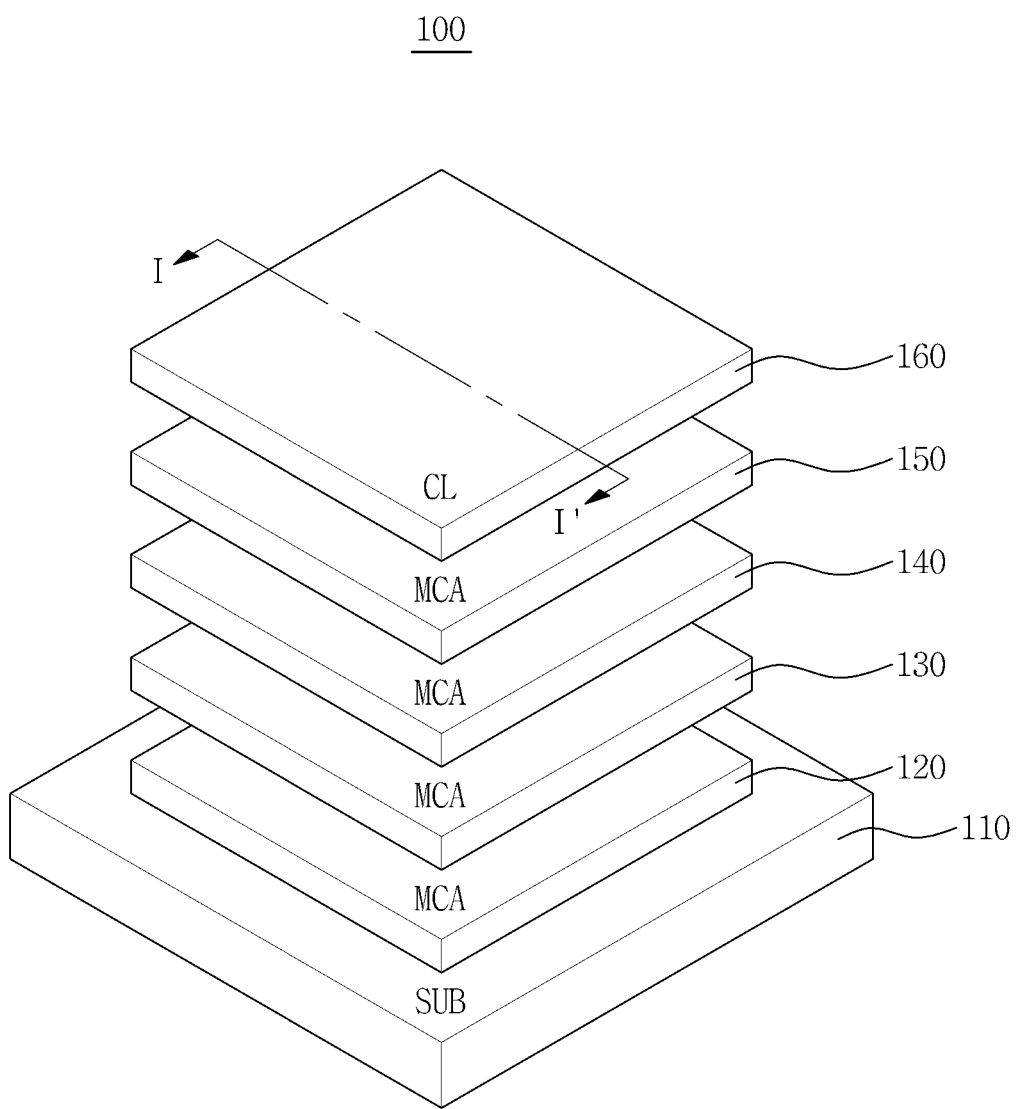
FIG. 1 is a perspective view illustrating a three-dimensional structure of a stacked semiconductor memory device according to an embodiment of the inventive concept.

Embodiments of the inventive concept are described below with reference to the accompanying drawings. These embodiments are presented as teaching examples and should not be construed to limit the scope of the inventive concept.

In the description that follows, where a feature is referred to as being "on," "connected to," or "coupled to" another feature, it can be directly on, connected or coupled to the other feature or intervening features may be present. In contrast, where a feature is referred to as being "directly on," "directly connected to," or "directly coupled to" another feature, there are no intervening features present. The term "and/or" indicates any and all combinations of one or more of the associated listed items.

Although the terms first, second, third, etc., are used herein to describe various features, these features should not be limited by these terms. Rather, these terms are only used to distinguish one feature from another. Accordingly, a first feature discussed below could be termed a second feature without departing from the scope of the inventive concept.

Spatially relative terms, such as "beneath," "below," "lower," "above," "upper" and the like, may be used to describe spatial relationships between different features. These terms, however, are intended to encompass different orientations of the device in addition to those depicted in the figures. For example, where a device in the figures is turned over, elements described as "below" or "beneath" other elements or features would then be oriented "above" the other elements or features. Thus, the term "below" can encompass both an orientation of above and below. A device may be otherwise oriented (e.g., rotated 90 degrees or at other orientations), with spatially relative descriptors interpreted accordingly.

The terminology used herein is for the purpose of describing particular embodiments only and is not intended to limit the inventive concept. The singular forms "a," "an" and "the" are intended to include plural forms as well, unless the context clearly indicates otherwise. The terms "comprises" and/or "comprising," when used in this specification, specify the presence of stated features, but do not preclude additional features.

Embodiments are described with reference to cross-sectional illustrations of idealized embodiments. As such, variations from the shapes of the illustrations are to be expected due to variations in manufacturing processes and other variables. Accordingly, embodiments should not be construed as limited to the particular shapes illustrated herein. As an example, an implanted region illustrated as a rectangle will typically have rounded or curved features and/or a gradient of implant concentration at its edges rather than a binary change from an implanted to a non-implanted region. Similarly, the formation of buried region by implantation may result in some implantation in a region between the buried region and a surface through which the implantation takes place.

Unless otherwise defined, all terms (including technical and scientific terms) used herein have the same meaning as commonly understood by one of ordinary skill in the art. Terms, such as those defined in commonly used dictionaries, should be interpreted as having a meaning that is consistent with their meaning in the context of the relevant art and should not be interpreted in an idealized or overly formal sense unless expressly so defined herein.

FIG. 1 is a perspective view illustrating a three-dimensional structure of a stacked semiconductor memory device 100 according to an embodiment of the inventive concept.

Referring to FIG. 1, stacked semiconductor memory device 100 comprises a semiconductor substrate 110, memory cell array layers 120, 130, 140 and 150, and a connection layer 160.

Semiconductor substrate 110 comprises a functional circuit such as a decoder, and memory cell array layers 120, 130, 140, and 150 are stacked above semiconductor substrate 110.

Connection layer 160 is stacked on semiconductor substrate 110 above memory cell array layers 120, 130, 140, and 150. Connection layer 160 electrically connects memory cell selecting lines arranged on memory cell array layers 120, 130, 140 and 150 to the functional circuit. Connection layer 160 is stacked independent of memory cell array layers 120, 130, 140, and 150 and can provide flexibility in the number and configuration of memory cell array layers in stacked semiconductor memory device 100, as will be described below.

Figure 2:
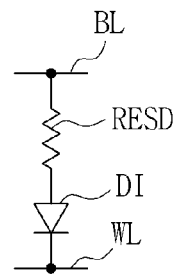
FIG. 2 is a circuit diagram illustrating an example of a memory cell that can be included in the stacked semiconductor memory device of FIG. 1.

FIG. 2 is a circuit diagram illustrating an example of a memory cell that can be included in a memory cell array of stacked semiconductor memory device 100 of FIG. 1.

Referring to FIG. 2, a memory cell comprises a resistive device RESD comprising a terminal connected to a bitline BL and a diode DI coupled between resistive device RESD and a wordline WL.

Figure 3:
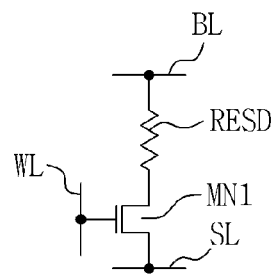
FIG. 3 is a circuit diagram illustrating another example of a memory cell that can be included in the stacked semiconductor memory device of FIG. 1.

FIG. 3 is a circuit diagram illustrating another example of a memory cell that can be included in a memory cell array of stacked semiconductor memory device 100 of FIG. 1.

Referring to FIG. 3, a memory cell comprises a resistive device RESD comprising a terminal connected to a bitline BL, and an NMOS transistor MN1 coupled between resistive device RESD and a source line SL and controlled by the wordline WL.

Figure 4:
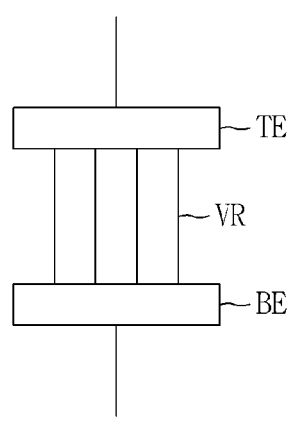
FIG. 4 is a diagram illustrating an example of a resistive device that can be included in the memory cell of FIG. 2 or FIG. 3.

FIG. 4 is a diagram illustrating an example of a resistive device RESD1 that can be included in the memory cell of FIG. 2 or FIG. 3.

Referring to FIG. 4, resistive device RESD1 comprises a top electrode TE, a bottom electrode BE, and a transition metal oxide VR disposed between top electrode TE and bottom electrode BE. Tantalum (Ta) or Platinum (Pt) can be used as top electrode TE and a cobalt oxide can be used as the transition metal oxide VR.

Figure 5:
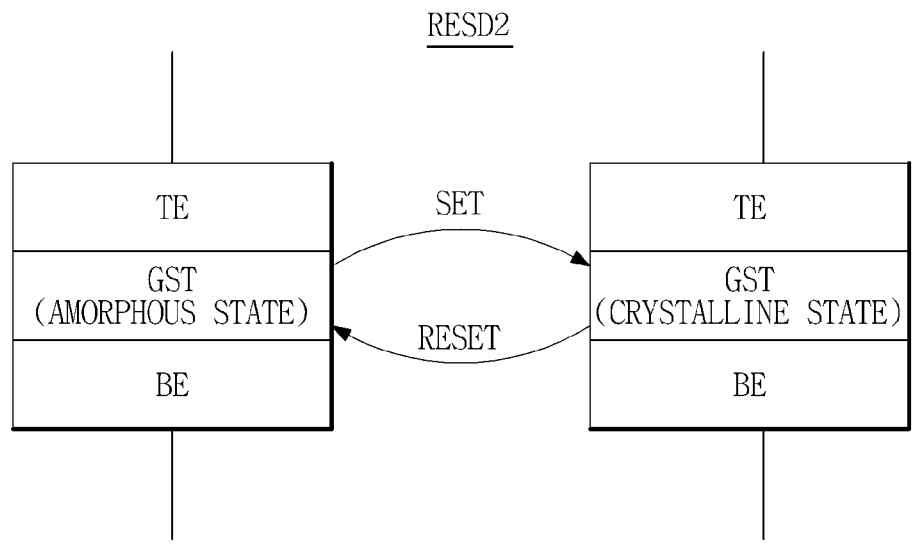
FIG. 5 is a diagram illustrating another example of a resistive device that can be included in the memory cell of FIG. 2 or FIG. 3.

FIG. 5 is a diagram illustrating another example of a resistive device that can be included in the memory cell of FIG. 2 or FIG. 3.

Referring to FIG. 5, resistive device RESD2 comprises a top electrode TE, a bottom electrode BE, and a phase change material GST disposed between top electrode TE and bottom electrode BE. Phase change material GST switches between an amorphous state and a crystalline state according to an applied temperature and a corresponding heating time. The resistance of phase change material GST has different resistances in the amorphous and crystalline states. An example of phase change material GST is GexSbyTez.

Figure 6:
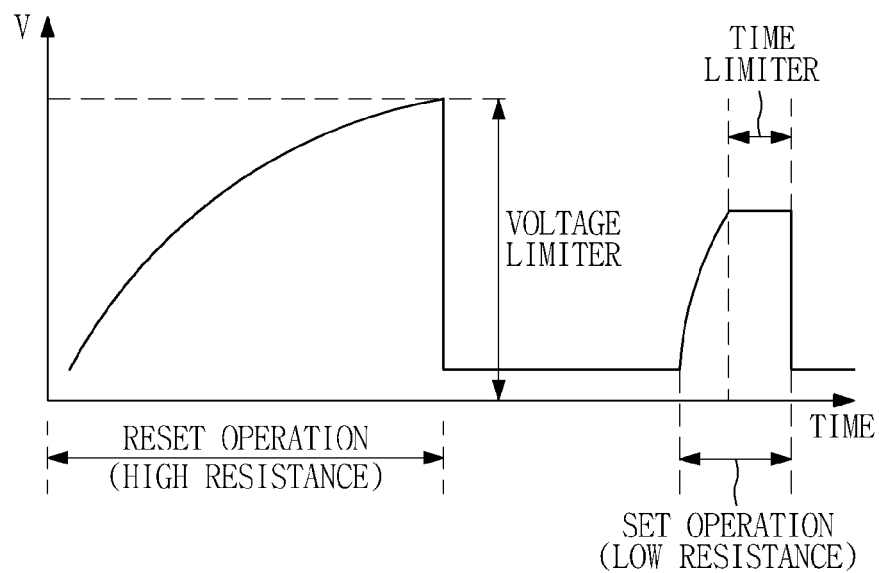
FIG. 6 is a waveform diagram illustrating a voltage across a memory cell comprising the resistive device of FIG. 4.

FIG. 6 is a waveform diagram illustrating a voltage across a memory cell comprising resistive device RESD1 of FIG. 4.

Referring to FIG. 6, the voltage across the memory cell corresponds to a voltage of a bitline and has different waveform characteristics in a reset operation mode and in a set operation mode. In the example of FIG. 6, a high resistance state having a high voltage level is defined as the reset operation mode, and a low resistance state having a low voltage level is defined as the set operation mode. Alternatively, the high resistance state can be defined as the set operation mode, and the low resistance state can be defined as the reset operation mode.

Figure 7:
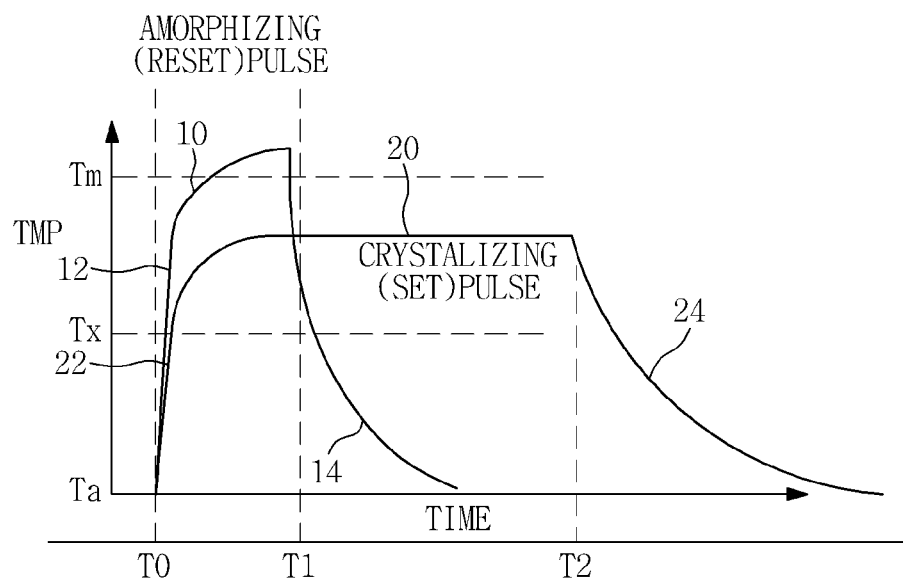
FIG. 7 is a diagram illustrating a phase-change property of the resistive device of FIG. 5.

FIG. 7 is a diagram illustrating a phase-change property of resistive device RESD2 of FIG. 5. In FIG. 7, a horizontal axis represents time and a vertical axis represents temperature TMP.

Referring to FIG. 7, a waveform labeled with reference numbers 10, 12 and 14 corresponds to an amorphous state of phase-change material GST, and a waveform labeled with reference numbers 20, 22 and 24 corresponds to a crystalline state of phase-change material GST. The amorphous state is achieved by heating phase-change material GST over a melting temperature Tm in a period T0-T1 and then quenching it. The crystalline state is achieved by heating phase-change material GST over a crystallization temperature Tx in a period T0-T2 and then cooling it.

In a resistive memory device comprising resistive device RESD2, where phase-change material GST is changed from the amorphous state to the crystalline state, the operation mode is defined as the set operation mode, and where phase-change material GST is changed from the crystalline state to the amorphous state, the operation mode is defined as the reset operation mode.

Figure 8:
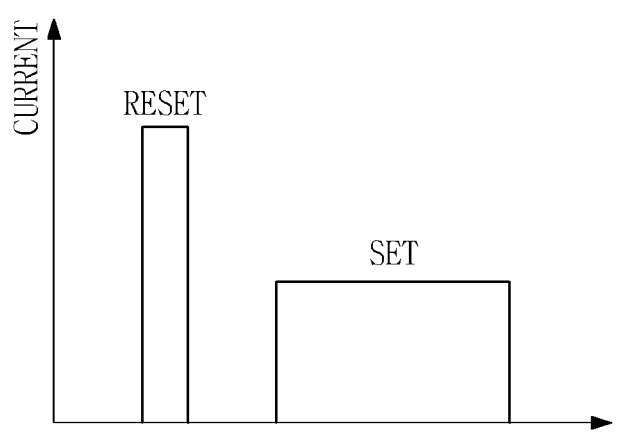
FIG. 8 is a waveform diagram illustrating a current applied to a memory cell comprising the resistive device of FIG. 5 to achieve the phase-change property shown in FIG. 7.

FIG. 8 is a diagram illustrating a waveform of a current applied to a memory cell comprising resistive device RESD2 of FIG. 5 to achieve the phase-change property shown in FIG. 7. In FIG. 8, a horizontal axis represents time and a vertical axis represents current.

Referring to FIG. 8, a current level of a reset pulse RESET is higher than a current level of a set pulse SET, and an application time of reset pulse RESET is shorter than an application time of set pulse SET. Reset pulse RESET and set pulse SET represent write currents applied to a memory cell corresponding to data "1" and data "0" respectively in a write operation mode.

Resistive memory devices can be categorized as unidirectional resistive memory devices in which resistance changes according to a magnitude of a voltage or a current applied to the resistive memory device, and bidirectional resistive memory devices in which resistance changes according to a magnitude and a direction of a voltage or a current applied to the resistive memory device.

Unlike a variable resistor memory cell array in a unidirectional resistive memory device, a polarity of a voltage applied across memory cells in a variable resistor memory cell array of a bidirectional resistive memory device can be changed according to input data.

Figure 9:
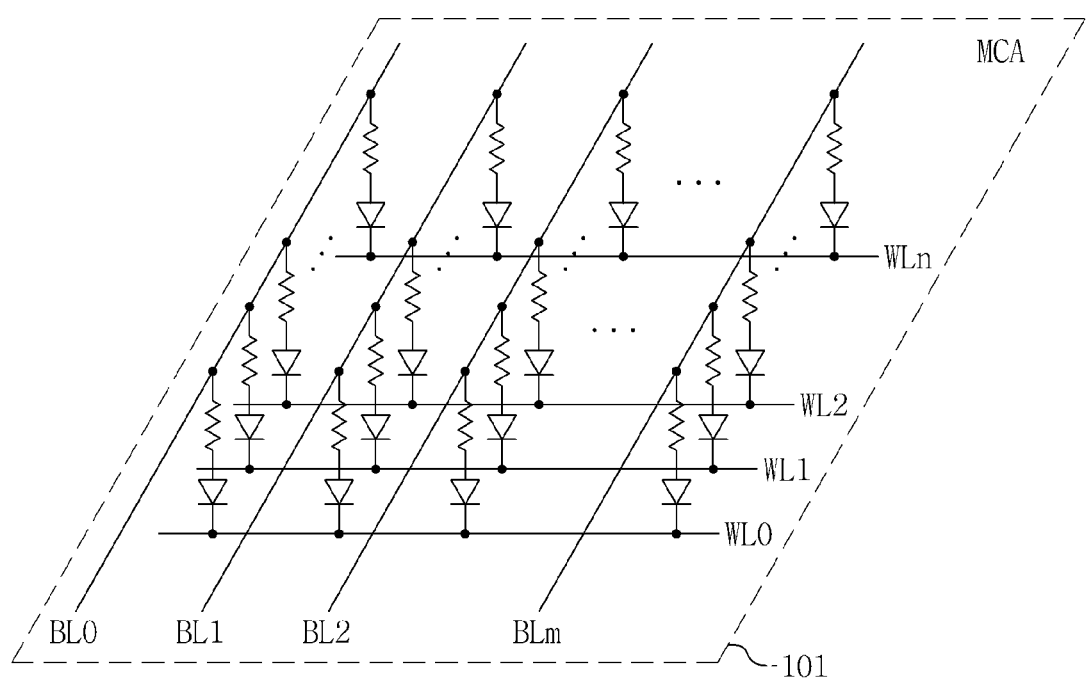
FIG. 9 is a circuit diagram illustrating an example of a memory cell array layer that can be included in the stacked semiconductor memory device of FIG. 1.

FIG. 9 is a circuit diagram illustrating an example of a memory cell array layer that can be included in the stacked semiconductor memory device of FIG. 1.

Referring to FIG. 9, bitlines BL0 through BLm and wordlines WL0 through WLn are arranged in a memory cell array layer (MCA) 101. MCA layer 101 has a cross-point structure in which memory cells are located at cross-points of bitlines BL0 through BLm and wordlines WL0 through WLn. Each of the memory cells shown in FIG. 9 has the same structure as the memory cell shown in FIG. 2 and comprises a resistive device and a diode connected in series to each other.

Figure 10:
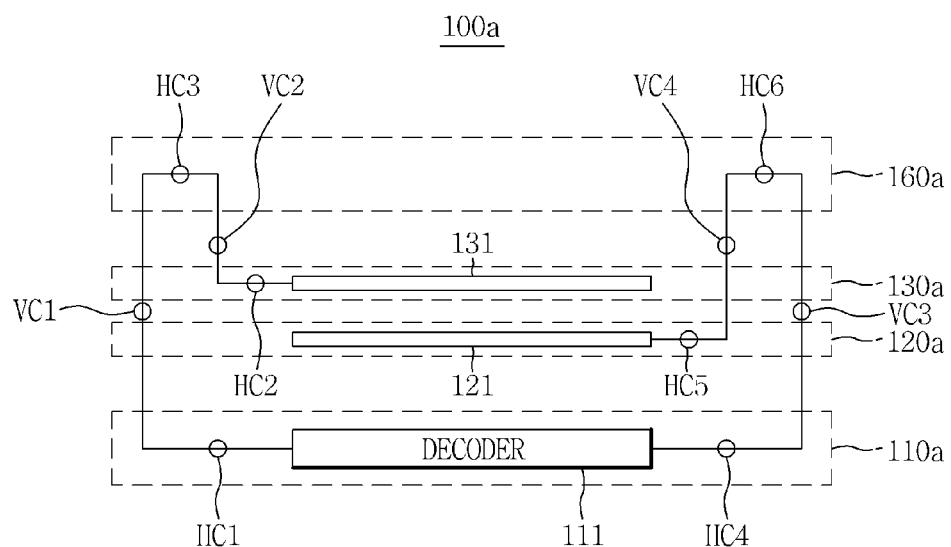
FIG. 10 is a cross-sectional view taken along a line I-I' in one embodiment the stacked semiconductor memory device of FIG. 1.

FIG. 10 is a cross-sectional view taken along a line I-I' in one embodiment of stacked semiconductor memory device 100 of FIG. 1. In the embodiment of FIG. 10, stacked semiconductor memory device 100 comprises two memory cell array layers stacked above semiconductor substrate 110.

Referring to FIG. 10, a semiconductor memory device 100a comprises a semiconductor substrate 110a, memory cell array layers 120a and 130a, and a connection layer 160a.

Semiconductor substrate 110a comprises a decoder 111, memory cell array layer 120a comprises a memory cell array region 121, and memory cell array layer 130a comprises a memory cell array region 131. Memory cell array layers 120a and 130a are stacked above semiconductor substrate 110a. Connection layer 160a is stacked independent of memory cell array layers 120a and 130a and electrically connects memory cell selecting lines arranged in each of memory cell array layers 120a and 130a to decoder 111.

Semiconductor memory device 100a electrically connects memory cell selecting lines arranged in each of memory cell array layers 120a and 130a to decoder 111 through horizontal connection lines and vertical connection lines. For example, memory cell selecting lines in memory cell array region 131 are electrically connected to decoder 111 through a horizontal connection line HC1, a vertical connection line VC1, a horizontal connection line HC2, a vertical connection line VC2, and a horizontal connection line HC3. Memory cell selecting lines in memory cell array region 121 are electrically connected to decoder 111 through a horizontal connection line HC4, a vertical connection line VC3, a horizontal connection line HC5, a vertical connection line VC4, and a horizontal connection line HC6.

Horizontal connection line HC1 and horizontal connection line HC4 are formed in semiconductor substrate 110a, horizontal connection line HC2 is formed in memory cell array layer 130a, and horizontal connection line HC5 is formed in memory cell array layer 120a. Horizontal connection line HC3 and horizontal connection line HC6 are formed in connection layer 160a.

Connection layer 160a electrically connects memory cell selecting lines arranged in memory cell array layers 120a and 130a to decoder 111, and it is stacked independent of memory cell array layers 120a and 130a. Accordingly, connection layer 160a provides flexibility for connecting memory cell selecting lines in memory cell array layers to decoder 111 in semiconductor substrate 110a.

For example, a connection structure between decoder 111 and wordlines or bitlines can change according to whether semiconductor memory device 100a comprises two memory cell array layers or four memory cell array layers. Semiconductor memory device 100a can connect or disconnect horizontal connection line HC3 and horizontal connection line HC6 of connection layer 160a to accommodate different numbers of memory cell array layers.

Figure 11:
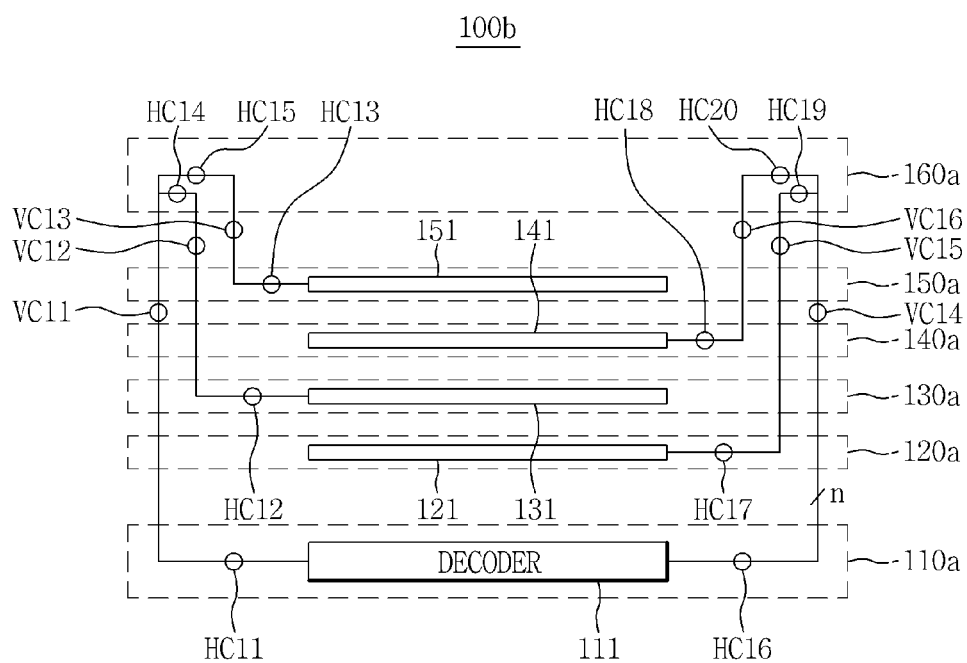
FIG. 11 is a cross-sectional view taken along a line I-I' in another embodiment of the stacked semiconductor memory device of FIG. 1.

FIG. 11 is a cross-sectional view taken along a line I-I' in another embodiment of stacked semiconductor memory device 100 of FIG. 1. In the embodiment of FIG. 11, stacked semiconductor memory device 100 comprises four memory cell array layers stacked above semiconductor substrate 110.

Referring to FIG. 11, a semiconductor memory device 100b comprises semiconductor substrate 110a, memory cell array layers 120a, 130a, 140a and 150a, and connection layer 160a.

Semiconductor substrate 110a comprises decoder 111, memory cell array layer 120a comprises memory cell array region 121, memory cell array layer 130a comprises memory cell array region 131, memory cell array layer 140a comprises a memory cell array region 141, and memory cell array layer 150a comprises a memory cell array region 151. Memory cell array layers 120a, 130a, 140a and 150a are stacked above semiconductor substrate 110a. Connection layer 160a is stacked independent of memory cell array layers 120a, 130a, 140a, and 150a and electrically connects memory cell selecting lines arranged in each of memory cell array layers 120a, 130a, 140a, and 150a to decoder 111.

Semiconductor memory device 100b electrically connects memory cell selecting lines arranged in each of memory cell array layers 120a, 130a, 140a, and 150a to decoder 111 through horizontal connection lines and vertical connection lines. For example, the memory cell selecting lines in memory cell array region 131 are electrically connected to decoder 111 through a horizontal connection line HC11, a vertical connection line VC11, a horizontal connection line HC12, a vertical connection line VC12, and a horizontal connection line HC14. Memory cell selecting lines in memory cell array region 121 are electrically connected to decoder 111 through a horizontal connection line HC16, a vertical connection line VC14, a horizontal connection line HC17, a vertical connection line VC15, and a horizontal connection line HC19.

Memory cell selecting lines in memory cell array region 151 are electrically connected to decoder 111 through a horizontal connection line HC11, a vertical connection line VC11, a horizontal connection line HC13, a vertical connection line VC13, and a horizontal connection line HC15. Memory cell selecting lines in memory cell array region 141 are electrically connected to decoder 111 through a horizontal connection line HC16, a vertical connection line VC14, a horizontal connection line HC18, a vertical connection line VC16, and a horizontal connection line HC20. Vertical connection lines VC11 and VC14 can comprise of a plurality of lines. Vertical connection lines VC11, VC12, VC13, VC14, VC15, and VC16 are typically formed using a VIA process.

Horizontal connection line HC11 and horizontal connection line HC16 are formed in semiconductor substrate 110a, horizontal connection line HC12 is formed in memory cell array layer 130a, and horizontal connection line HC17 is formed in memory cell array layer 120a. Horizontal connection line HC13 is formed in memory cell array layer 150a, and horizontal connection line HC18 is formed in memory cell array layer 140a. Horizontal connection lines HC14, HC15, HC19, and HC20 are formed in connection layer 160a.

Stacked semiconductor memory device 100b of FIG. 11 comprises a connection layer formed independent of memory cell array layers 120a, 130a, 140a, and 150a to electrically connect corresponding memory cell selecting lines to a functional circuit such as decoder 111 formed on semiconductor substrate 110a. Consequently, semiconductor memory device 100b provides flexibility for connecting memory cell selecting lines in memory cell array layers to the functional circuit.

In semiconductor memory device 100b, horizontal connection lines HC14, HC15, HC19, and HC20 of connection layer 160a can be connected in a final process. Stacked semiconductor memory device 100b can electrically connect memory selecting lines in memory cell array layers 120a, 130a, 140a, and 150a to decoder 111 after metal processes of memory cell array layers 120a, 130a, 140a, and 150a are completed.

In semiconductor memory device 100b of FIG. 11, memory cell selecting lines arranged in some of memory cell array layers 120a, 130a, 140a, and 150a are electrically connected to decoder 111 on the left side of memory cell array layers 120a, 130a, 140a, and 150a, and memory cell selecting lines arranged in other memory cell array layers are electrically connected to decoder 111 on the right side of memory cell array layers 120a, 130a, 140a, and 150a.

In some embodiments, memory cell selecting lines arranged in each of memory cell array layers 120a, 130a, 140a, and 150a are electrically connected to decoder 111 on alternating left and right sides of memory cell array layers 120a, 130a, 140a, and 150a.

Figure 12:
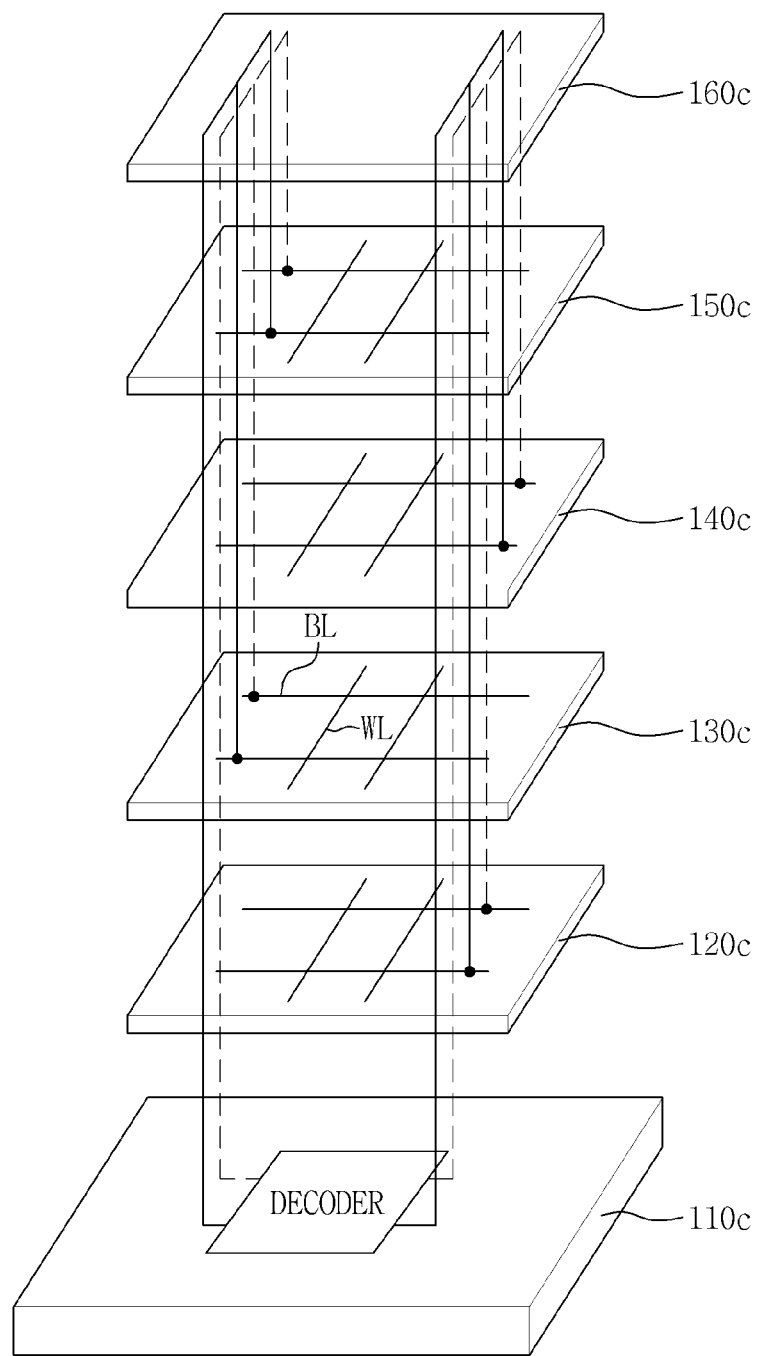
FIG. 12 is a cross-sectional view illustrating electrical connections between a functional circuit in a semiconductor substrate and bitlines in memory cell array layers of the stacked semiconductor memory device of FIG. 1.

FIG. 12 is a cross-sectional view illustrating electrical connections between a functional circuit in a semiconductor substrate and bitlines in memory cell array layers of stacked semiconductor memory device 100 of FIG. 1.

Referring to FIG. 12, a semiconductor memory device 100c comprises a semiconductor substrate 110c, memory cell array layers 120c, 130c, 140c, and 150c and a connection layer 160c.

Each of memory cell array layers 120c, 130c, 140c, and 150c comprises wordlines WL and bitlines BL arranged in a matrix. Each layer of semiconductor memory device 100c of FIG. 12 corresponds to a layer of semiconductor memory device 100b of FIG. 11. Each of vertical connection lines VC11 and VC14 comprises a plurality of connection lines of the same number as the number of bitlines in each of the memory cell array layers.

Figure 13:
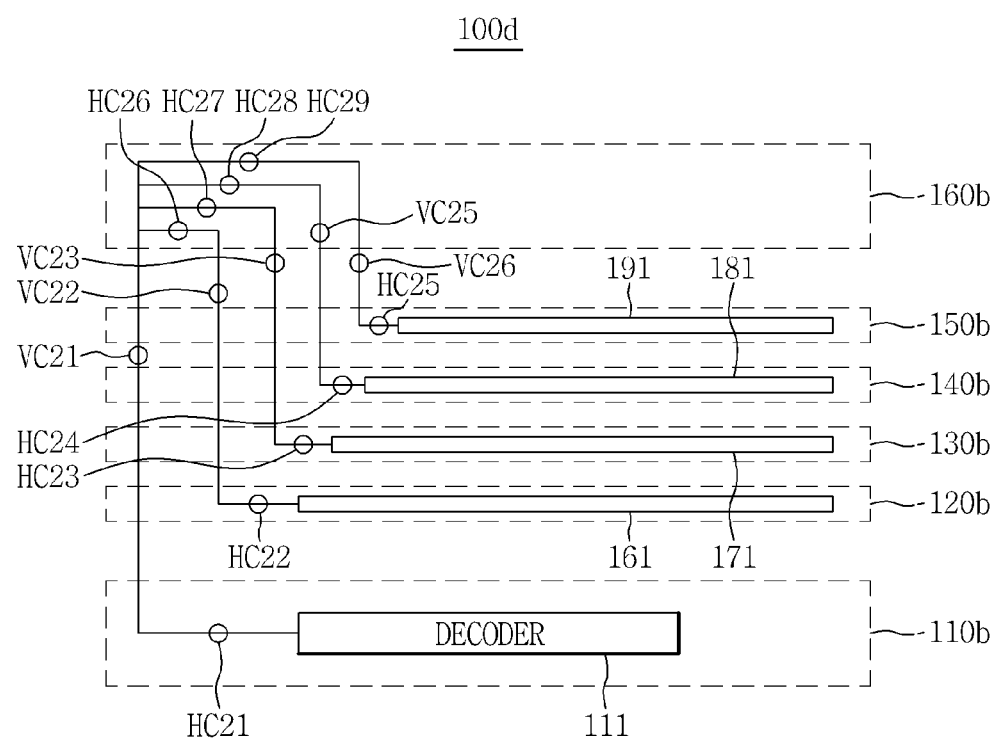
FIG. 13 is a cross-sectional view taken along a line I-I' in another embodiment of the stacked semiconductor memory device of FIG. 1.

FIG. 13 is a cross-sectional view taken along a line I-I' in an embodiment of stacked semiconductor memory device 100 of FIG. 1. In the embodiment of FIG. 13, stacked semiconductor memory device 100 comprises four memory cell array layers that are stacked above semiconductor substrate 110 and have different cell array regions from each other.

Referring to FIG. 13, a semiconductor memory device 100d comprises a semiconductor substrate 110b, memory cell array layers 120b, 130b, 140b, and 150b and a connection layer 160b.

Semiconductor substrate 110b comprises decoder 111, memory cell array layer 120b comprises a memory cell array region 161, memory cell array layer 130b comprises a memory cell array region 171, memory cell array layer 140b comprises a memory cell array region 181, and memory cell array layer 150b comprises a memory cell array region 191. Memory cell array layers 120b, 130b, 140b, and 150b are stacked on semiconductor substrate 110b. Connection layer 160b is formed independent of memory cell array layers 120b, 130b, 140b, and 150b and electrically connects memory cell selecting lines arranged in each of memory cell array layers 120b, 130b, 140b, and 150b to decoder 111.

Semiconductor memory device 100d electrically connects memory cell selecting lines arranged in each of memory cell array layers 120b, 130b, 140b, and 150b to decoder 111 through horizontal connection lines and vertical connection lines. For example, memory cell selecting lines in memory cell array region 161 are electrically connected to decoder 111 through a horizontal connection line HC21, a vertical connection line VC21, a horizontal connection line HC22, a vertical connection line VC22, and a horizontal connection line HC26. Memory cell selecting lines in memory cell array region 171 are electrically connected to decoder 111 through a horizontal connection line HC21, a vertical connection line VC21, a horizontal connection line HC23, a vertical connection line VC23, and a horizontal connection line HC27.

Memory cell selecting lines in memory cell array region 181 are electrically connected to decoder 111 through a horizontal connection line HC21, a vertical connection line VC21, a horizontal connection line HC24, a vertical connection line VC25, and a horizontal connection line HC28. Memory cell selecting lines in memory cell array region 191 are electrically connected to decoder 111 through a horizontal connection line HC21, a vertical connection line VC21, a horizontal connection line HC25, a vertical connection line VC26, and a horizontal connection line HC29. Vertical connection line VC21 typically comprises of a plurality of lines. Vertical connection lines VC21, VC22, VC23, VC25 and VC26 are typically formed using a VIA process.

Horizontal connection line HC21 is formed in semiconductor substrate 110b, horizontal connection line HC22 is formed in memory cell array layer 120b, and horizontal connection line HC23 is formed in memory cell array layer 130b. Horizontal connection line HC24 is formed in memory cell array layer 140b, and horizontal connection line HC25 is formed in memory cell array layer 150b. Horizontal connection lines HC26, HC27, HC28, and HC29 are formed in connection layer 160b.

Stacked semiconductor memory device 100d comprises connection layer 160d stacked independent of memory cell array layers 120b through 150b to electrically connect corresponding memory cell selecting lines to a functional circuit such as decoder 111 formed on semiconductor substrate 110b. Consequently, in stacked semiconductor memory device 100d, stacking problems are not generated where a decoding scheme or a number of memory cell array layers changes. Rather, semiconductor memory device 100d can provide flexibility by connecting horizontal connection lines HC26, HC27, HC28, and HC29 in connection layer 160b in a final process.

In stacked semiconductor memory device 100d, cell array regions 161, 171, 181, and 191 in memory cell array layers 120b, 130b, 140b, and 150b have different sizes. In particular, memory cell array layers 120b, 130b, 140b, and 150b have smaller memory cell array regions 161, 171, 181, and 191 as a distance from semiconductor substrate 110b increases. This configuration provides space for forming vertical connection lines VC22, VC23, VC25, and VC26. Vertical connection lines VC22, VC23, VC25, and VC26 are typically formed using a VIA process.

The sizes of memory cell array regions of memory cell array layers 120b, 130b, 140b, and 150b decrease to scale as memory cell array layers 120b, 130b, 140b, and 150b are farther from semiconductor substrate 110b. In other words, the memory cell array regions vary according to the sizes of memory cell array layers 120b, 130b, 140b, and 150b.

Figure 14:
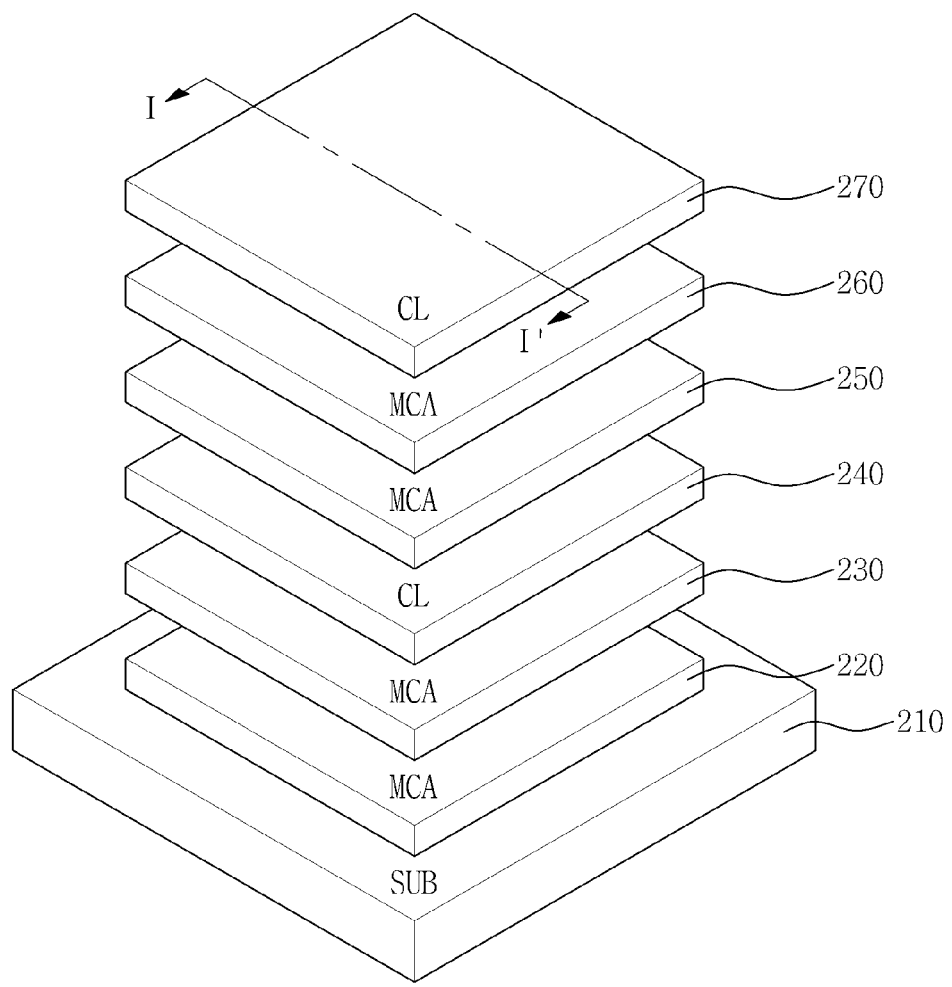
FIG. 14 is a perspective view illustrating a three-dimensional structure of a stacked semiconductor memory device according to an embodiment of the inventive concept.

FIG. 14 is a perspective view illustrating a three-dimensional structure of a stacked semiconductor memory device 200 according to an embodiment of the inventive concept.

Referring to FIG. 14, stacked semiconductor memory device 200 comprises a semiconductor substrate 210, memory cell array layers 220, 230, 250, and 260 and connection layers 240 and 270.

Semiconductor substrate 210 comprises a functional circuit such as a decoder. Memory cell array layers 220, 230, 250, and 260 are stacked above semiconductor substrate 210. Connection layers 240 and 270 are stacked above semiconductor substrate 210 independent of memory cell array layers 220, 230, 250 and 260. Connection layers 240 and 270 electrically connect memory cell selecting lines arranged on memory cell array layers 220, 230, 250, and 260 to the functional circuit.

Figure 15:
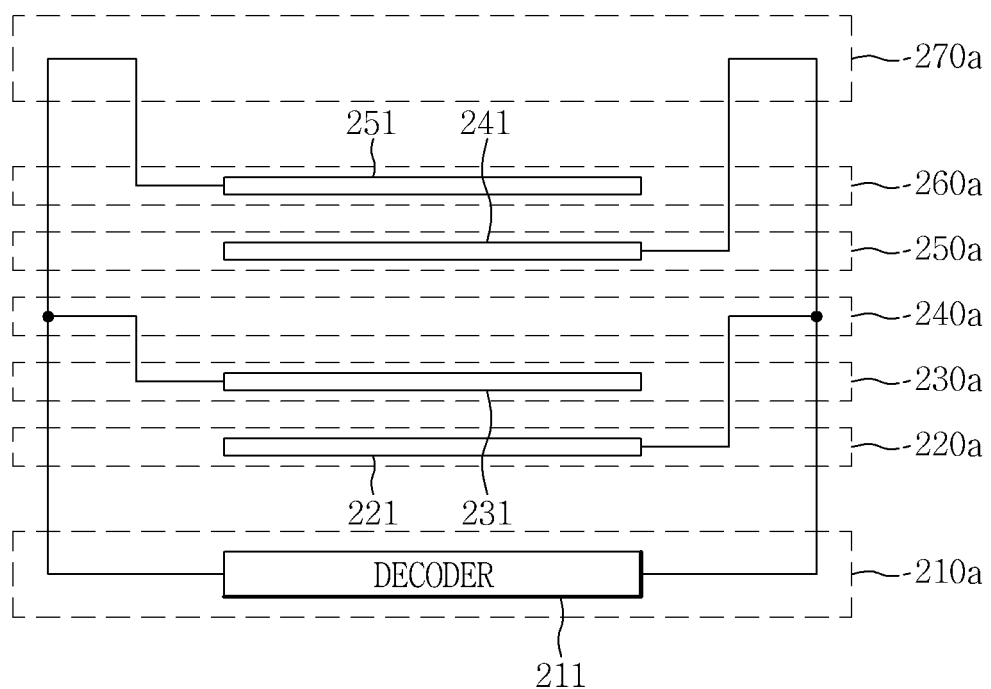
FIG. 15 is a cross-sectional view taken along a line I-I' in an embodiment of the stacked semiconductor memory device of FIG. 14.

FIG. 15 is a cross-sectional view taken along a line I-I' in an embodiment of stacked semiconductor memory device 200 of FIG. 14. In the embodiment of FIG. 15, stacked semiconductor memory device 200 comprises four memory cell array layers.

Referring to FIG. 15, semiconductor memory device 200a comprises a semiconductor substrate 210a, memory cell array layers 220a, 230a, 250a, and 260a, and connection layers 240a and 270a.

Semiconductor substrate 210a comprises a decoder 211, memory cell array layer 220a comprises a memory cell array region 221, memory cell array layer 230a comprises a memory cell array region 231, memory cell array layer 250a comprises a memory cell array region 241, and memory cell array layer 260a comprises a memory cell array region 251. Memory cell array layers 220a, 230a, 250a and 260a are stacked above semiconductor substrate 210a. Connection layers 240a and 270a are stacked independent of memory cell array layers 220a, 230a, 250a and 260a, and they electrically connect memory cell selecting lines arranged in each of memory cell array layers 220a, 230a, 250a and 260a to decoder 211.

Cell array region 221 included in memory cell array layer 220a and cell array region 231 included in memory cell array layer 230a are electrically connected to decoder 211 through horizontal connection lines included in connection layer 240a. Cell array region 241 included in memory cell array layer 250a and cell array region 251 included in memory cell array layer 260a are electrically connected to decoder 211 through horizontal connection lines included in connection layer 270a.

Semiconductor memory device 200a electrically connects memory cell selecting lines in each of memory cell array layers 220a, 230a, 250a, and 260a to decoder 211 through horizontal connection lines and vertical connection lines. Memory cell selecting lines in memory cell array layers 230a and 260a are connected to decoder 211 through horizontal connection lines and vertical connection lines located on the left side of memory cell array regions 221, 231, 241, and 251, and memory cell selecting lines arranged in memory cell array layers 220a and 250a are connected to decoder 211 formed on semiconductor substrate 210a through horizontal connection lines and vertical connection lines located on the right side of memory cell array regions 221, 231, 241, and 251.

Stacked semiconductor memory device 200a of FIG. 15 comprises connection layers stacked independent of the memory cell array layers. The connection layers electrically connects memory cell selecting lines arranged in the memory cell array layers to a functional circuit such as a decoder formed on semiconductor substrate 210a. Consequently, in stacked semiconductor memory device 200a of FIG. 15, stacking problems are not generated even where a decoding scheme or a number of memory cell array layers changes.

Memory cell selecting lines arranged in memory cell array layers 220a and 230a are connected to decoder 211 formed on semiconductor substrate 210a through connection layer 240a located above memory cell array layers 220a and 230a. Memory cell selecting lines arranged in memory cell array layers 250a and 260a are connected to decoder 211 formed on semiconductor substrate 210a through connection layer 270a located above memory cell array layers 250a and 260a.

Stacked semiconductor memory device 200a electrically connects memory selecting lines in array layer groups through connection lines 240a and 270a to decoder 211 after a metal process of each of the array layer groups is completed. In the embodiment of FIG. 15, memory cell array layers 220a and 230a constitute an array layer group, and memory cell array layers 250a and 260a constitute another array layer group.

In stacked semiconductor memory device 200a of FIG. 15, connection lines 240a and 270a are stacked on semiconductor substrate 210a independent of memory cell array layers 220a, 230a, 250a, and 260a. Consequently, semiconductor memory device 200a provides flexibility for connecting memory cell selecting lines in the memory cell array layers to the functional circuit in the semiconductor substrate.

Figure 16:
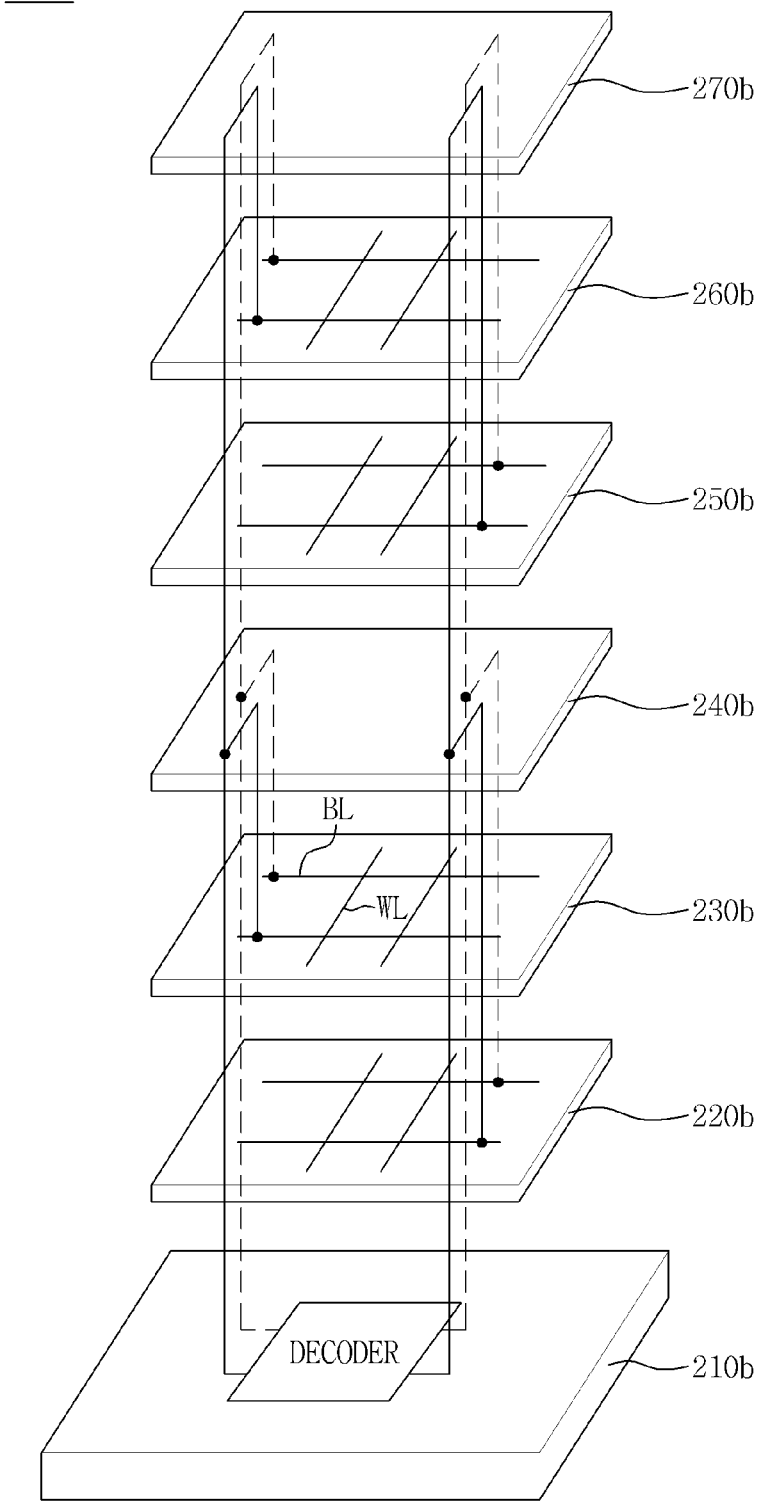
FIG. 16 is a cross-sectional view illustrating electrical connections of a functional circuit in a semiconductor substrate and bitlines in memory cell array layers of the stacked semiconductor memory device of FIG. 14.

FIG. 16 is a cross-sectional view illustrating electrical connections of a functional circuit in a semiconductor substrate and bitlines in memory cell array layers in the stacked semiconductor memory device of FIG. 14.

Referring to FIG. 16, a semiconductor memory device 200b comprises a semiconductor substrate 210b, memory cell array layers 220b, 230b, 250b and 260b, and connection layers 240b and 270b.

Each of memory cell array layers 220b, 230b, 250b and 260b comprises wordlines WL and bitlines BL arranged in a matrix. Each layer of semiconductor memory device 200b shown in the cross-sectional view of FIG. 16 corresponds to a layer of semiconductor memory device 200a shown in the cross-sectional view of FIG. 15. In FIG. 15, each of the vertical connection lines comprises a plurality of connection lines of the same number as the number of bitlines of each of the memory cell array layers.

Figure 17:
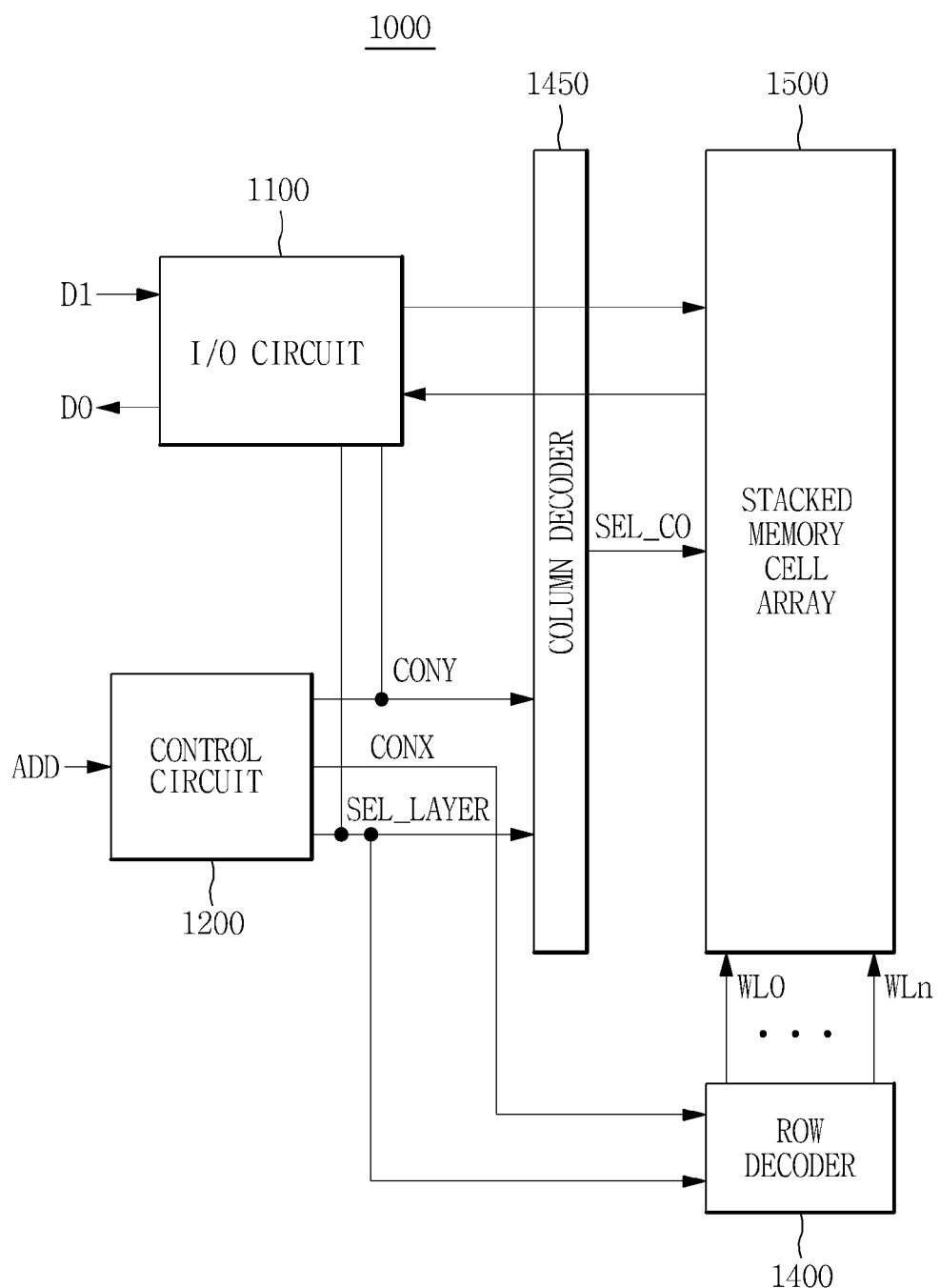
FIG. 17 is a block diagram illustrating a stacked semiconductor memory device according to an embodiment of the inventive concept.

FIG. 17 is a block diagram illustrating a stacked semiconductor memory device 1000 according to an embodiment of the inventive concept.

Referring to FIG. 17, stacked semiconductor memory device 1000 comprises an input/output circuit 1100, a control circuit 1200, a row decoder 1400, a column decoder 1450, and a stacked memory cell array 1500.

Control circuit 1200 sets program modes of memory cell array layers based on address signals ADD and program information, controls timing and voltage levels of address signals ADD to generate a row control signal CONX and a column control signal CONY, and generates a layer selecting signal SEL_LAYER based on row control signal CONX and column control signal CONY.

Row decoder 1400 decodes row control signal CONX and layer selecting signal SEL_LAYER to generate wordline driving signals WL0 through WLn, and provides wordline driving signals WL0 through WLn to stacked memory cell array 1500. Column decoder 1450 decodes column control signal CONY and layer selecting signal SEL_LAYER to generate a column selecting signal SEL_CO, and provides column selecting signal SEL_CO to stacked memory cell array 1500. Input/output circuit 1100 comprises a sense amplifier and a write driving circuit, and provides input data DI to stacked memory cell array 1500 in response to column control signal CONY and layer selecting signal SEL_LAYER in a write operation mode. Input/output circuit 1100 senses and amplifies a voltage of a bitline to generate output data DO in response to column control signal CONY and layer selecting signal SEL_LAYER in a read operation mode.

Stacked semiconductor memory device 1000 comprises a connection line to connect memory cell array layers stacked on a substrate and memory cell selecting lines arranged in each of the memory cell array layers to a decoder included in the semiconductor substrate as shown in FIG. 1 or FIG. 14. The connection layer is disposed above an uppermost memory cell array layer or over each of multiple memory cell array groups.

In the embodiment of FIG. 17, stacked memory cell array 1500 is formed in memory cell array layers, and input/output circuit 1100, control circuit 1200, row decoder 1400 and column decoder 1450 are formed in a semiconductor substrate.

Figure 18:
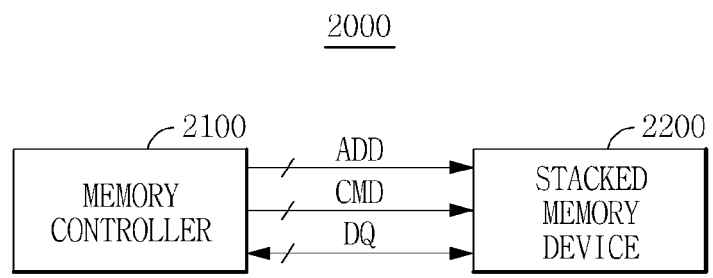
FIG. 18 is a block diagram illustrating a memory system comprising a stacked semiconductor memory device according to an embodiment of the inventive concept.

FIG. 18 is a block diagram illustrating a memory system 2000 comprising a stacked semiconductor memory device according to an embodiment of the inventive concept.

Referring to FIG. 18, memory system 2000 comprises a memory controller 2100 and a stacked semiconductor memory device 2200.

Memory controller 2100 generates address signals ADD and command signals CMD and provides address signals ADD and command signals CMD to stacked semiconductor memory device 2200 through buses. Data DQ is transmitted between memory controller 2100 and stacked semiconductor memory device 2200 through the buses.

Stacked semiconductor memory device 2200 has a structure of one of stacked semiconductor memory devices 100 and 200, and stores data DQ or outputs stored data based on address signals ADD and command signals CMD. Stacked semiconductor memory device 2200 comprises a connection layer to connect memory cell array layers stacked above a substrate and memory cell selecting lines arranged in each of the memory cell array layers to a decoder included in a semiconductor substrate. The connection layer is disposed above an uppermost memory cell array layer or over each of multiple memory cell array groups. Accordingly, stacked semiconductor memory device 2200 provides flexibility for connecting memory cell selecting lines arranged in the memory cell array layers to the functional circuit in a semiconductor substrate.

Figure 19:
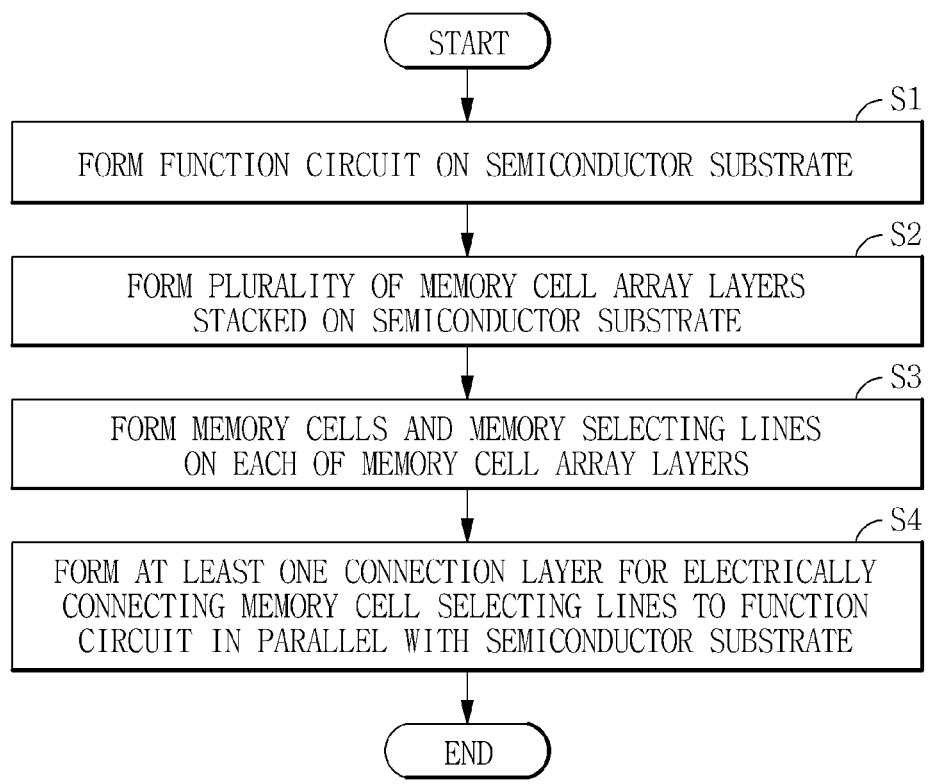
FIG. 19 is a flowchart illustrating a method of fabricating a stacked semiconductor memory device according to an embodiment of the inventive concept.

FIG. 19 is a flowchart illustrating a method of fabricating a stacked semiconductor memory device according to an embodiment of the inventive concept.

Referring to FIG. 19, the method comprises forming a functional circuit on a semiconductor substrate (S1), and forming a plurality of memory cell array layers stacked above the semiconductor substrate in parallel with the semiconductor substrate (S2). The method further comprises forming memory cells and memory cell selecting lines on each of the memory cell array layers (S3), and forming at least one connection layer for electrically connecting the memory cell selecting lines to the functional circuit in parallel with the semiconductor substrate (S4).

In the method of FIG. 19, the connection layer is formed above an uppermost memory cell array layer or over array layer groups formed from the plurality of memory cell array layers.

Although the above-described embodiments relate to stacked semiconductor memory devices comprising resistive memory cell arrays, the embodiments can be modified to comprise other types of memory cell arrays.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A stacked semiconductor memory device, comprising:
a semiconductor substrate;
a functional circuit formed on the semiconductor substrate;
a plurality of memory cell array layers stacked above the semiconductor substrate; and
at least one connection layer stacked above the semiconductor substrate independent of the memory cell array layers, wherein the at least one connection layer electrically connects memory cell selecting lines of the memory cell array layers to the functional circuit.

2. The stacked semiconductor memory device of claim 1, wherein the at least one connection layer is formed above an uppermost memory cell array layer among the memory cell array layers.

3. The stacked semiconductor memory device of claim 2, wherein the memory cell selecting lines are electrically connected to the functional circuit after a metal process of the memory cell array layers is completed.

4. The stacked semiconductor memory device of claim 1, wherein the plurality of memory cell array layers are divided into a plurality of array layer groups separated by the at least one connection layer.

5. The stacked semiconductor memory device of claim 4, wherein the at least one connection layer is disposed above each of the array layer groups.

6. The stacked semiconductor memory device of claim 4, wherein memory cell selecting lines included in each of the array layer groups are electrically connected to the functional circuit after a metal process of each of the array layer groups is completed.

7. The stacked semiconductor memory device of claim 1, wherein the memory cell selecting lines comprise bitlines or wordlines for selecting memory cells in each of the memory cell array layers.

8. The stacked semiconductor memory device of claim 1, wherein the memory cell array layers comprise resistive memory cells.

9. The stacked semiconductor memory device of claim 1, wherein memory cell selecting lines arranged in each of the memory cell array layers are electrically connected to the functional circuit through at least one horizontal connection line and at least one vertical connection line.

10. The stacked semiconductor memory device of claim 9, wherein memory cell selecting lines arranged in some of the memory cell array layers are electrically connected to the functional circuit on a left side of the memory cell array layers, and memory cell selecting lines arranged in other memory cell array layers are electrically connected to the functional circuit on a right side of the memory cell array layers.

11. The stacked semiconductor memory device of claim 10, wherein memory cell selecting lines arranged in the memory cell array layers are alternately connected to the functional circuit on the left side and right side of the memory cell array layers.

12. The stacked semiconductor memory device of claim 1, wherein the memory cell array layers comprise memory cell array regions having different sizes from each other.

13. The stacked semiconductor memory device of claim 12, wherein the memory cell array regions decrease in size as a distance from the semiconductor substrate increases.

14. The stacked semiconductor memory device of claim 12, wherein the memory cell array layers decrease in size as a distance from the semiconductor substrate increases, and the corresponding memory cell array regions decrease to scale with the memory cell array layers.

15. A memory system, comprising:
  a memory controller configured to generate address signals and command signals; and
  a stacked semiconductor memory device that stores received data or outputs stored data based on the address signals and the command signals, wherein the stacked semiconductor memory device comprises:
  a semiconductor substrate;
  a functional circuit formed on the semiconductor substrate;
  a plurality of memory cell array layers stacked above the semiconductor substrate; and
  at least one connection layer stacked above the semiconductor substrate independent of the memory cell array layers, wherein the at least one connection layer electrically connects memory cell selecting lines of the memory cell array layers to the functional circuit.

16. The memory system of claim 15, wherein the at least one connection layer is formed above an uppermost memory cell array layer among the memory cell array layers.

17. The memory system of claim 15, wherein the plurality of memory cell array layers are divided into a plurality of array layer groups separated by the at least one connection layer.

* * * * *